(12) United States Patent
Wu et al.

(10) Patent No.: US 12,484,217 B2
(45) Date of Patent: *Nov. 25, 2025

(54) EMBEDDED FLASH MEMORY DEVICE WITH FLOATING GATE EMBEDDED IN A SUBSTRATE

(71) Applicant: Taiwan Semiconductor Manufacturing Co., Ltd., Hsinchu (TW)

(72) Inventors: Wei Cheng Wu, Zhubei (TW); Harry-Hak-Lay Chuang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,676

(22) Filed: Jan. 4, 2024

(65) Prior Publication Data
US 2024/0147716 A1    May 2, 2024

Related U.S. Application Data

(60) Continuation of application No. 17/231,204, filed on Apr. 15, 2021, now Pat. No. 11,903,191, which is a
(Continued)

(51) Int. Cl.
*H10B 41/30*    (2023.01)
*H01L 21/306*    (2006.01)
(Continued)

(52) U.S. Cl.
CPC ....... *H10B 41/30* (2023.02); *H01L 21/30604* (2013.01); *H01L 21/3212* (2013.01);
(Continued)

(58) Field of Classification Search
CPC ......... H10B 41/49; H10B 41/20; H10B 41/30
See application file for complete search history.

(56) References Cited

U.S. PATENT DOCUMENTS

| | | | |
|---|---|---|---|
| 6,052,311 | A | 4/2000 | Fu |
| 6,160,297 | A | 12/2000 | Shimizu et al. |

(Continued)

FOREIGN PATENT DOCUMENTS

| | | |
|---|---|---|
| KR | 1020060049590 | 5/2006 |
| KR | 20060091332 | 8/2006 |

(Continued)

OTHER PUBLICATIONS

Chatterjee, et al., "Sub-100nm Gate Length Metal Gate NMOS Transistors Fabricated by a Replacement Gate Process", IEDM, 1997, pp. 821-824.

(Continued)

*Primary Examiner* — Vincent Wall
(74) *Attorney, Agent, or Firm* — Slater Matsil, LLP

(57) ABSTRACT

An embedded flash memory device includes a gate stack, which includes a bottom dielectric layer extending into a recess in a semiconductor substrate, and a charge storage layer over the bottom dielectric layer. The charge storage layer includes a portion in the recess. The gate stack further includes a top dielectric layer over the charge storage layer, and a metal gate over the top dielectric layer. Source and drain regions are in the semiconductor substrate, and are on opposite sides of the gate stack.

20 Claims, 18 Drawing Sheets

Related U.S. Application Data division of application No. 16/231,066, filed on Dec. 21, 2018, now abandoned, which is a continuation of application No. 14/980,147, filed on Dec. 28, 2015, now Pat. No. 10,163,919, which is a division of application No. 13/924,331, filed on Jun. 21, 2013, now Pat. No. 9,230,977.

(51) Int. Cl.
| | | |
|---|---|---|
| *H01L 21/321* | (2006.01) | |
| *H10B 10/00* | (2023.01) | |
| *H10B 41/49* | (2023.01) | |
| *H10B 43/00* | (2023.01) | |
| *H10B 43/30* | (2023.01) | |
| *H10D 64/01* | (2025.01) | |
| *H10D 84/01* | (2025.01) | |
| *H10D 84/03* | (2025.01) | |

(52) U.S. Cl.
CPC .............. *H10B 41/49* (2023.02); *H10B 43/00* (2023.02); *H10B 43/30* (2023.02); *H10D 64/017* (2025.01); *H10D 64/035* (2025.01); *H10D 84/0144* (2025.01); *H10D 84/038* (2025.01); *H10B 10/18* (2023.02)

(56) References Cited

U.S. PATENT DOCUMENTS

| | | | |
|---|---|---|---|
| 6,693,026 B2 | 2/2004 | Kim | |
| 6,958,513 B2 | 10/2005 | Wang | |
| 7,091,089 B2 | 8/2006 | Steimle | |
| 7,091,130 B1 | 8/2006 | Rao et al. | |
| 7,279,737 B2 | 10/2007 | Nara et al. | |
| 7,323,740 B2 * | 1/2008 | Park ................ | H01L 21/76224 |
| | | | 257/E21.546 |
| 7,364,969 B2 | 4/2008 | Prinz et al. | |
| 7,463,530 B2 | 12/2008 | Lue et al. | |
| 8,946,806 B2 | 2/2015 | Tan et al. | |
| 9,230,977 B2 * | 1/2016 | Wu ................ | H10D 64/035 |
| 2001/0004120 A1 * | 6/2001 | Colclaser ............. | H10B 41/40 |
| | | | 257/326 |
| 2002/0036317 A1 | 3/2002 | Matsui et al. | |
| 2003/0122204 A1 | 7/2003 | Nomoto et al. | |
| 2006/0000081 A1 | 1/2006 | Kondo | |
| 2006/0199335 A1 * | 9/2006 | Rao ................ | H10B 41/40 |
| | | | 438/257 |
| 2006/0231909 A1 | 10/2006 | Hsu et al. | |
| 2007/0020840 A1 | 1/2007 | Chindalore | |
| 2007/0048935 A1 * | 3/2007 | Abbott ............... | H10D 30/0411 |
| | | | 438/257 |
| 2007/0238249 A1 * | 10/2007 | Swift ................ | H10D 30/6893 |
| | | | 257/E21.422 |
| 2008/0153233 A1 * | 6/2008 | Abbott ................ | H10B 41/30 |
| | | | 257/E21.422 |
| 2009/0155992 A1 | 6/2009 | Zheng et al. | |
| 2010/0002894 A1 * | 1/2010 | Lan ................ | H04R 31/00 |
| | | | 381/163 |
| 2011/0018051 A1 | 1/2011 | Kim et al. | |
| 2012/0181591 A1 * | 7/2012 | Chen ................ | H10D 86/215 |
| | | | 257/314 |
| 2012/0217513 A1 * | 8/2012 | Tega ................ | H10D 30/668 |
| | | | 257/77 |
| 2013/0082318 A1 * | 4/2013 | Liu ................ | H10D 84/0181 |
| | | | 257/E21.546 |
| 2013/0264652 A1 * | 10/2013 | Zhu ................ | H01L 21/283 |
| | | | 257/369 |
| 2014/0193972 A1 * | 7/2014 | Bell ................ | H01L 23/49894 |
| | | | 438/618 |
| 2014/0374814 A1 * | 12/2014 | Wu ................ | H10B 43/40 |
| | | | 257/326 |
| 2014/0374815 A1 * | 12/2014 | Wu ................ | H10D 64/035 |
| | | | 257/326 |
| 2015/0069524 A1 * | 3/2015 | Hong ................ | H10D 86/201 |
| | | | 438/587 |
| 2016/0005756 A1 * | 1/2016 | Chuang ................ | H10D 84/038 |
| | | | 257/314 |

FOREIGN PATENT DOCUMENTS

| | | |
|---|---|---|
| KR | 1020070002320 | 1/2007 |
| KR | 1020080050459 | 6/2008 |
| KR | 20130112353 | 5/2014 |
| KR | 20130008666 | 12/2014 |
| WO | 2006085718 | 8/2006 |

OTHER PUBLICATIONS

Kim et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, Jun. 16-18, 2009, pp. 186-187.

* cited by examiner

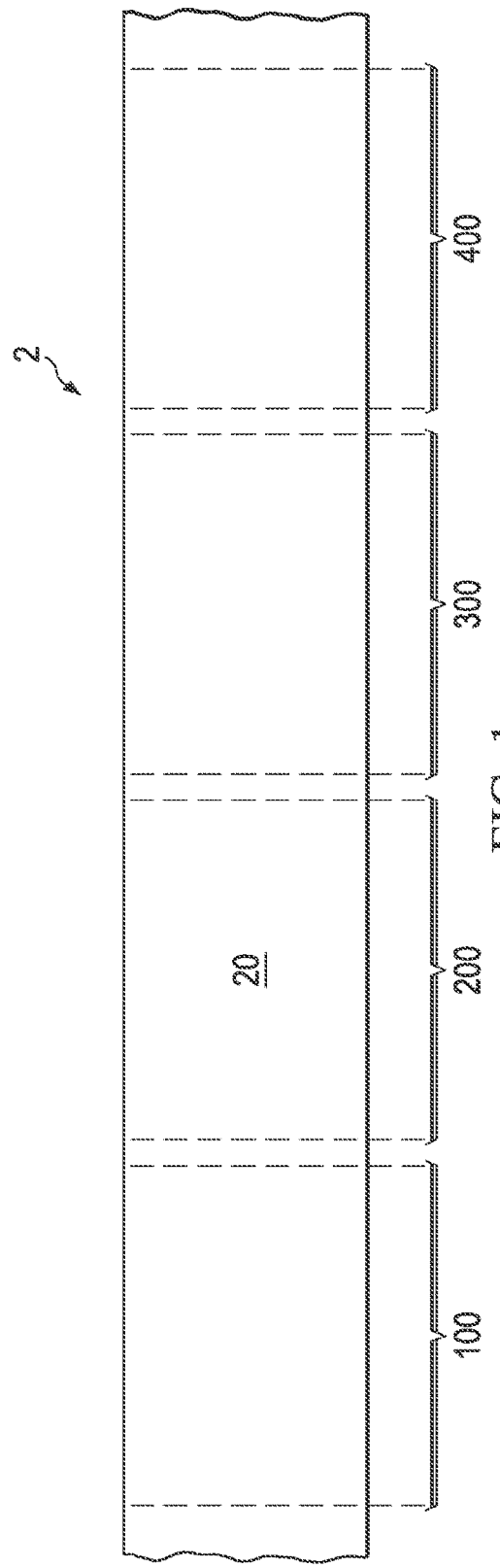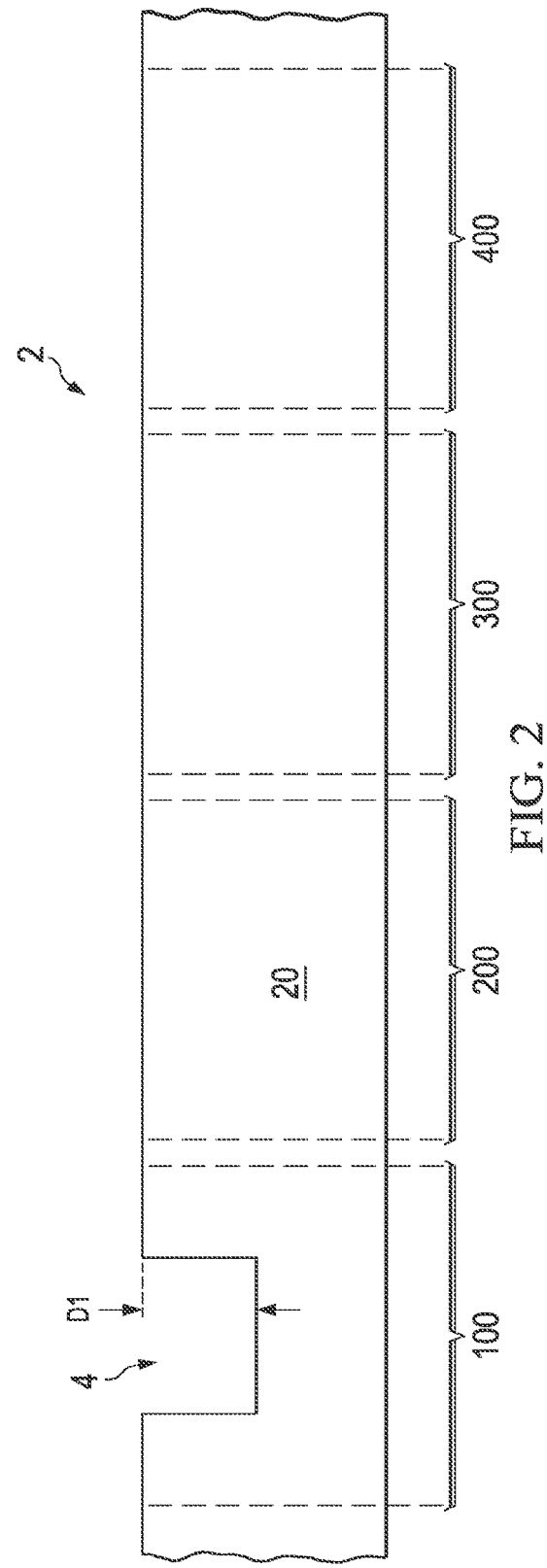

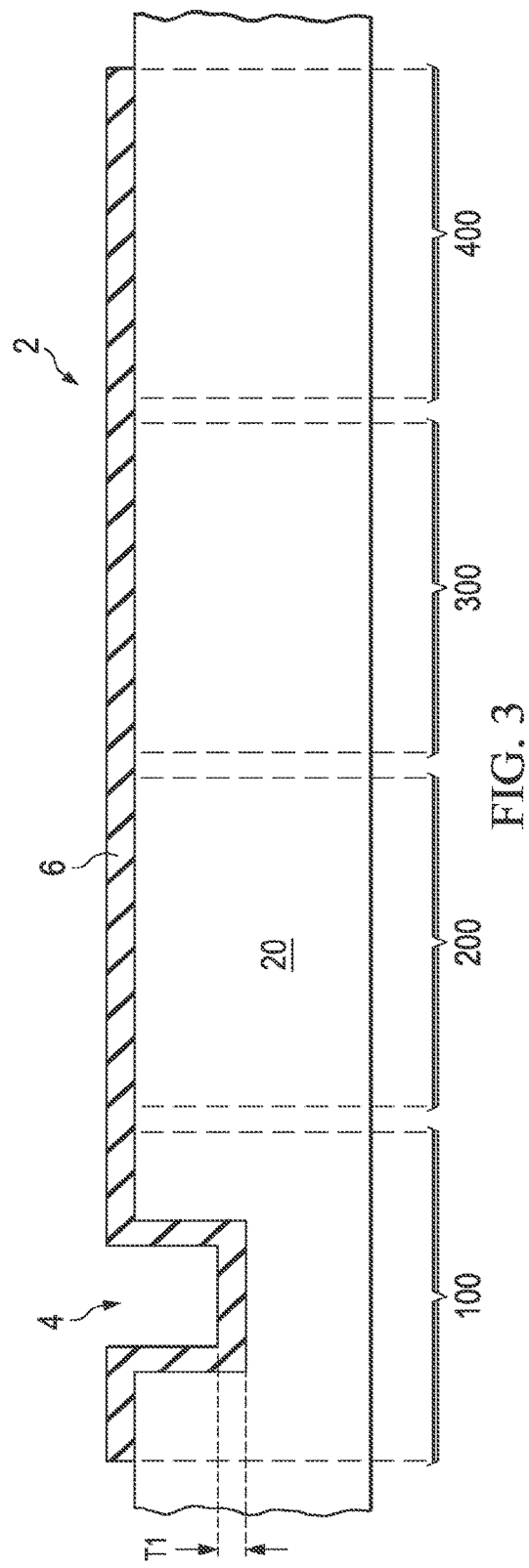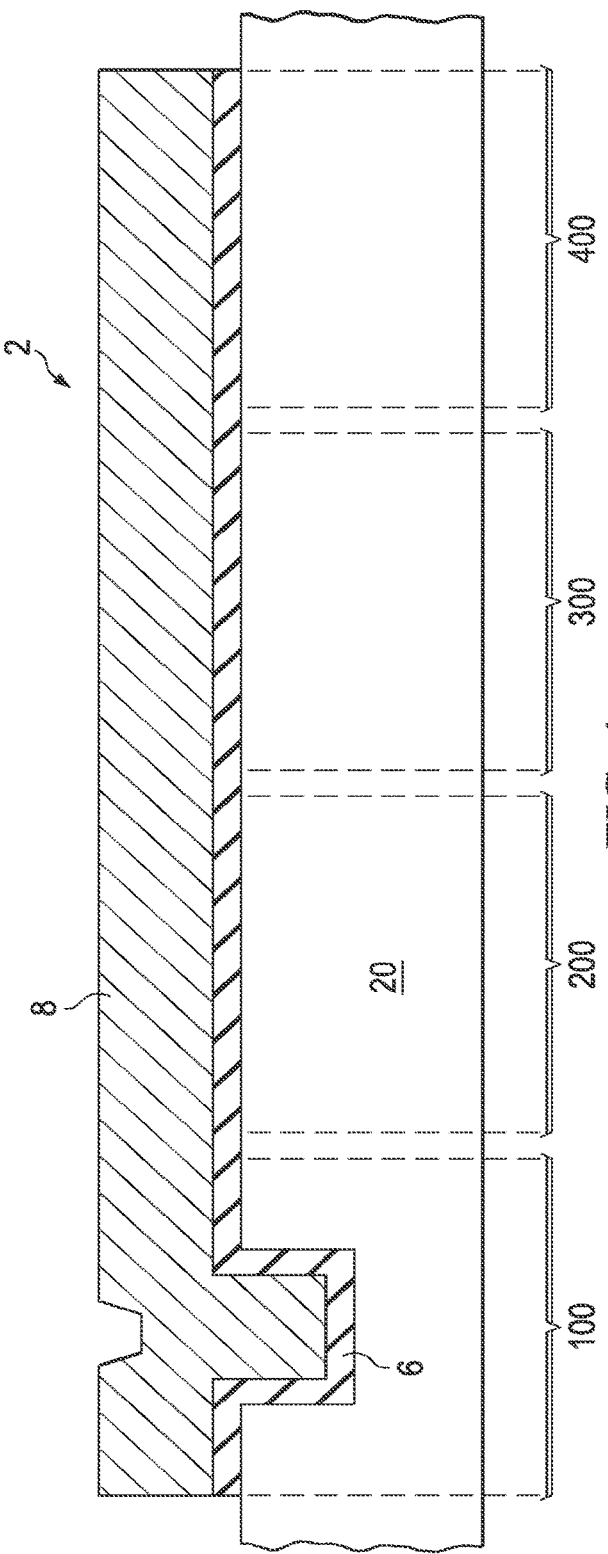

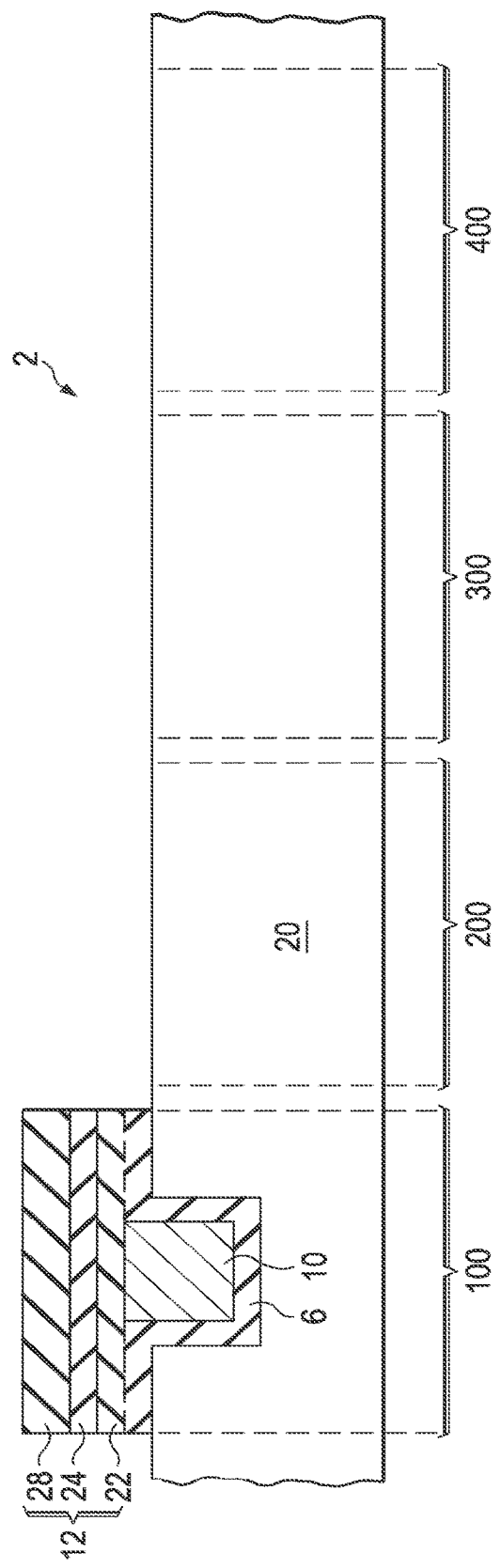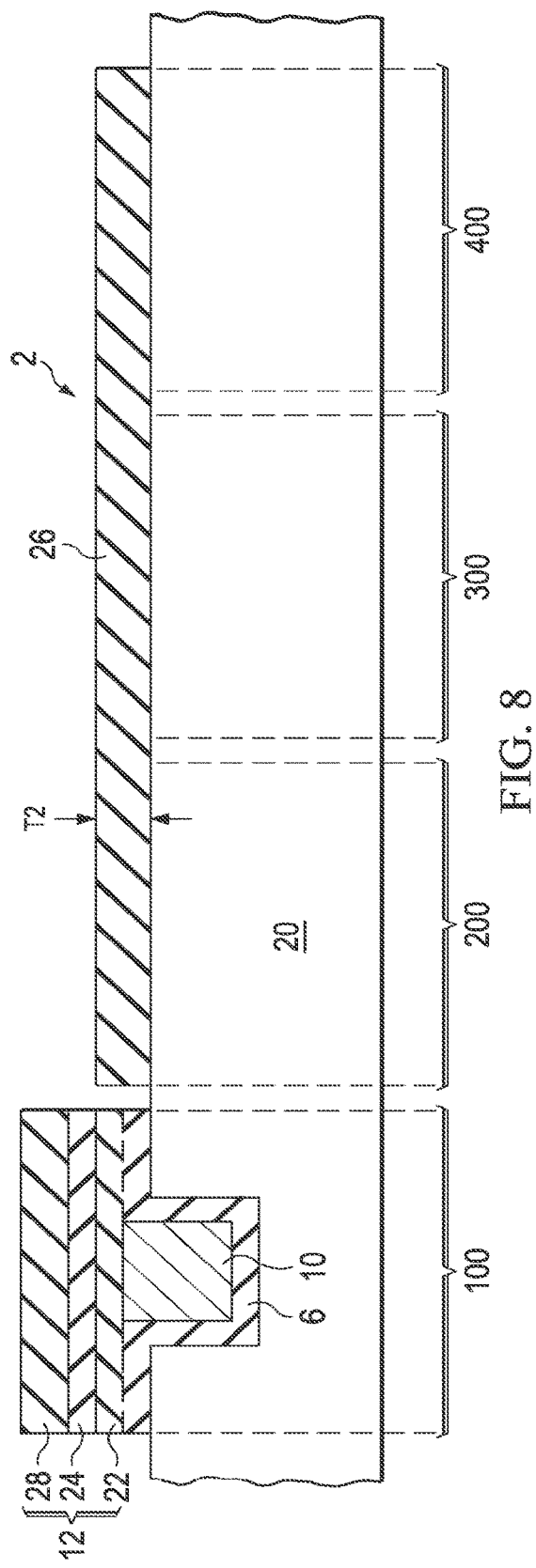

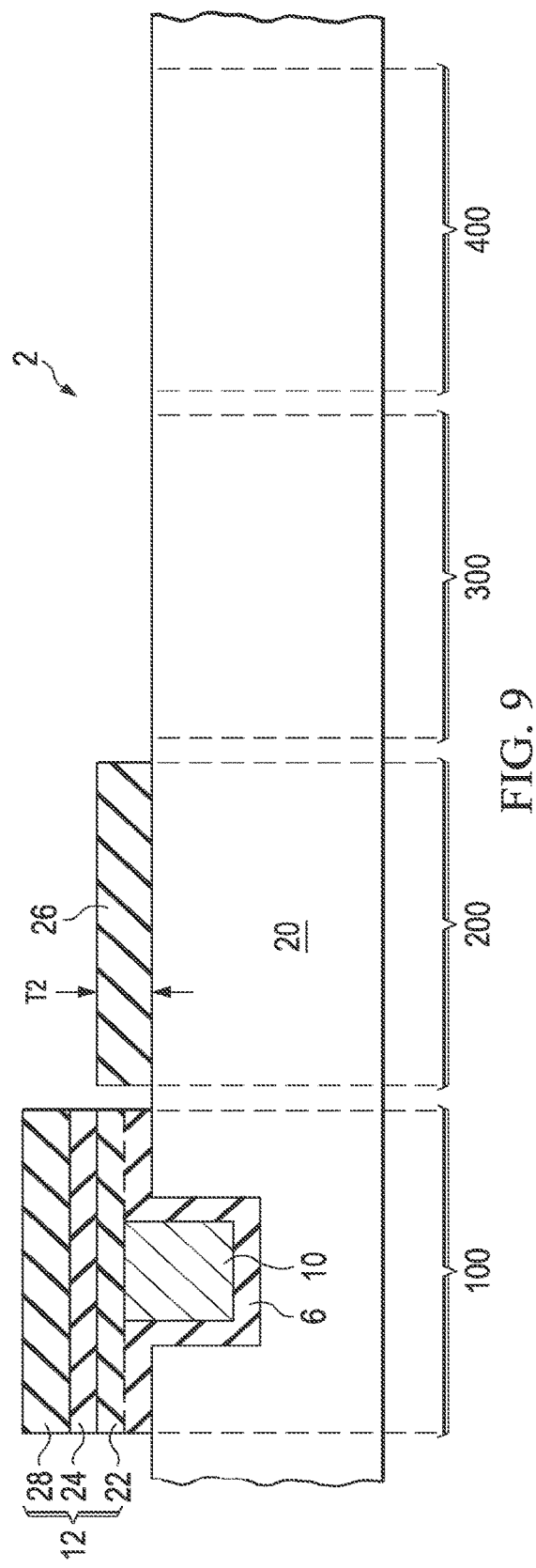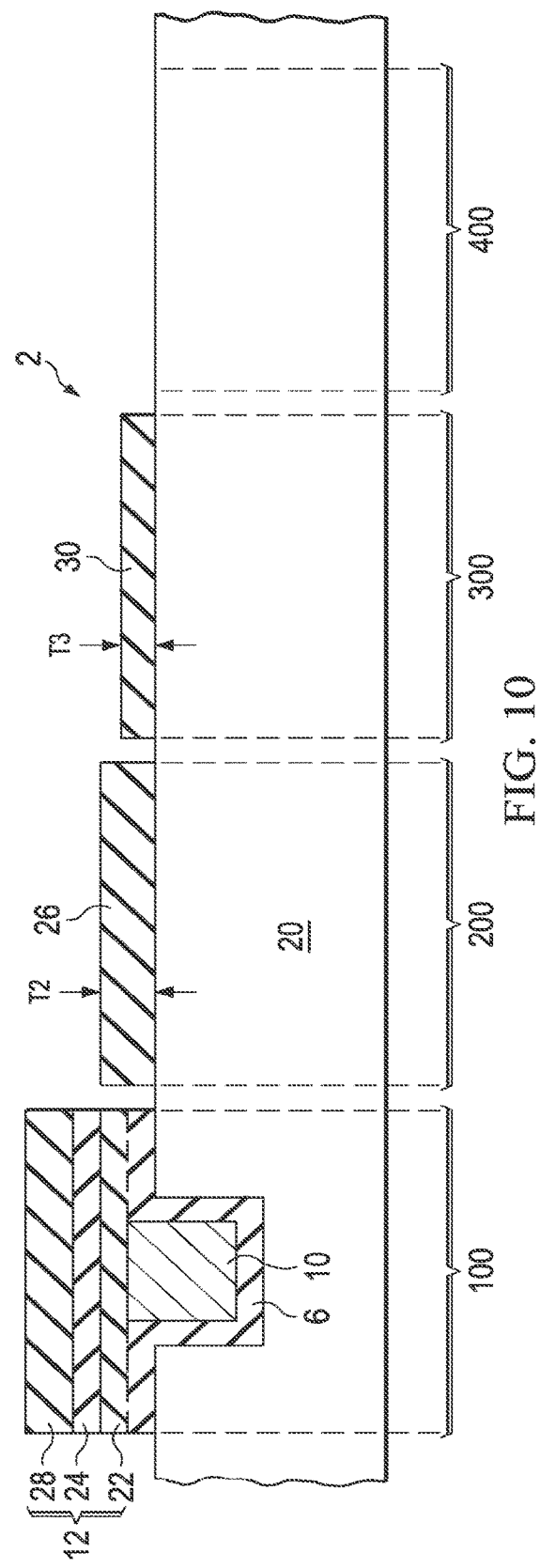

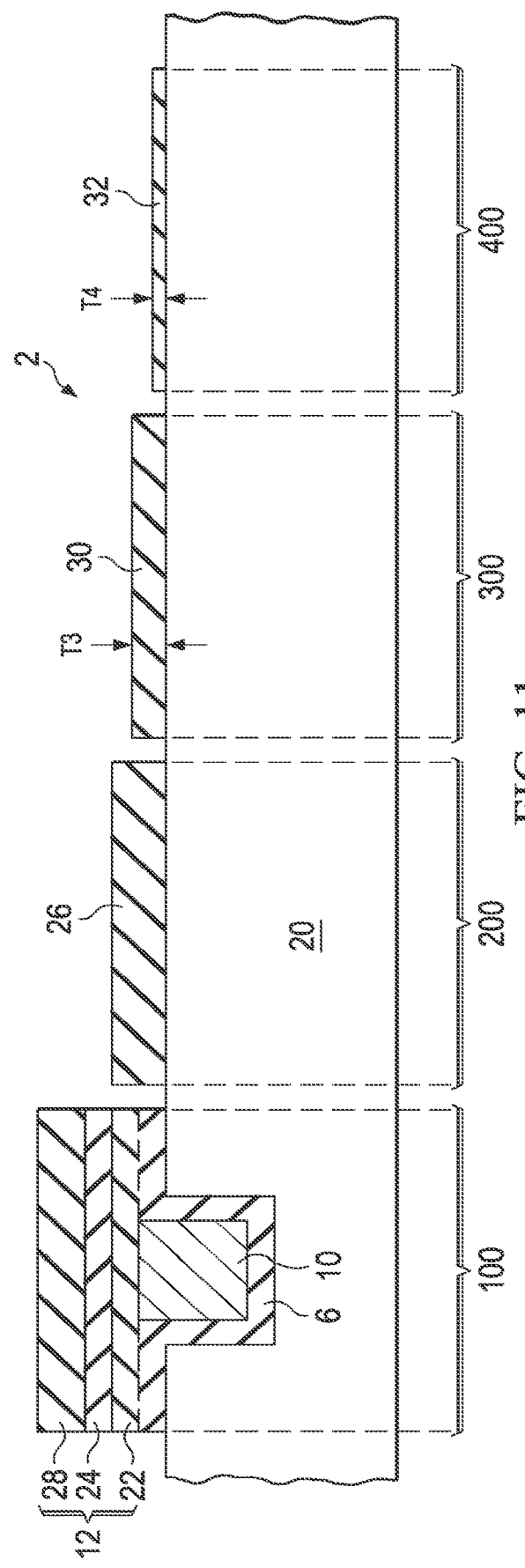

EMBEDDED FLASH MEMORY DEVICE WITH FLOATING GATE EMBEDDED IN A SUBSTRATE

PRIORITY CLAIM AND CROSS-REFERENCE

This application is a continuation of U.S. patent application Ser. No. 17/231,204 filed on Apr. 15, 2021, entitled "Embedded Flash Memory Device with Floating Gate Embedded in a Substrate," which is a divisional of U.S. patent application Ser. No. 16/231,066 filed on Dec. 21, 2018, entitled "Embedded Flash Memory Device with Floating Gate Embedded in a Substrate," which application is a continuation of U.S. patent application Ser. No. 14/980,147 filed on Dec. 28, 2015, entitled "Embedded Flash Memory Device with Floating Gate Embedded in a Substrate," now U.S. Pat. No. 10,163,919 issued on Dec. 25, 2018, which application is a divisional of Ser. No. 13/924,331, filed on Jun. 21, 2013, now U.S. Pat. No. 9,230,977 issued on Jan. 5, 2016, entitled "An Embedded Flash Memory Device with Floating Gate Embedded in a Substrate," which applications are incorporated herein by reference.

BACKGROUND

Flash memories, which use dielectric trapping layers or floating layers to store charges, are often used in System-On-Chip (SOC) technology, and are formed on the same chip along with other integrated circuits. For example, High-Voltage (HV) circuits, Input/output (IO) circuits, core circuits, and Static Random Access Memory (SRAM) circuits are often integrated on the same chip as the flash memories. The respective flash memories are often referred to as embedded memories since they are embedded in the chip on which other circuits are formed, as compared to the flash memories formed on chips that do not have other circuits. Flash memories have structures different from HV circuit devices, IO circuit devices, core circuit devices, and SRAM circuit devices. Therefore, the embedding of memory devices with other types of devices faces challenges when the technology evolves.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 18 are cross-sectional views of intermediate stages in the manufacturing of embedded memory devices and other types of devices in accordance with some exemplary embodiments;

DETAILED DESCRIPTION OF ILLUSTRATIVE EMBODIMENTS

Figure 5:
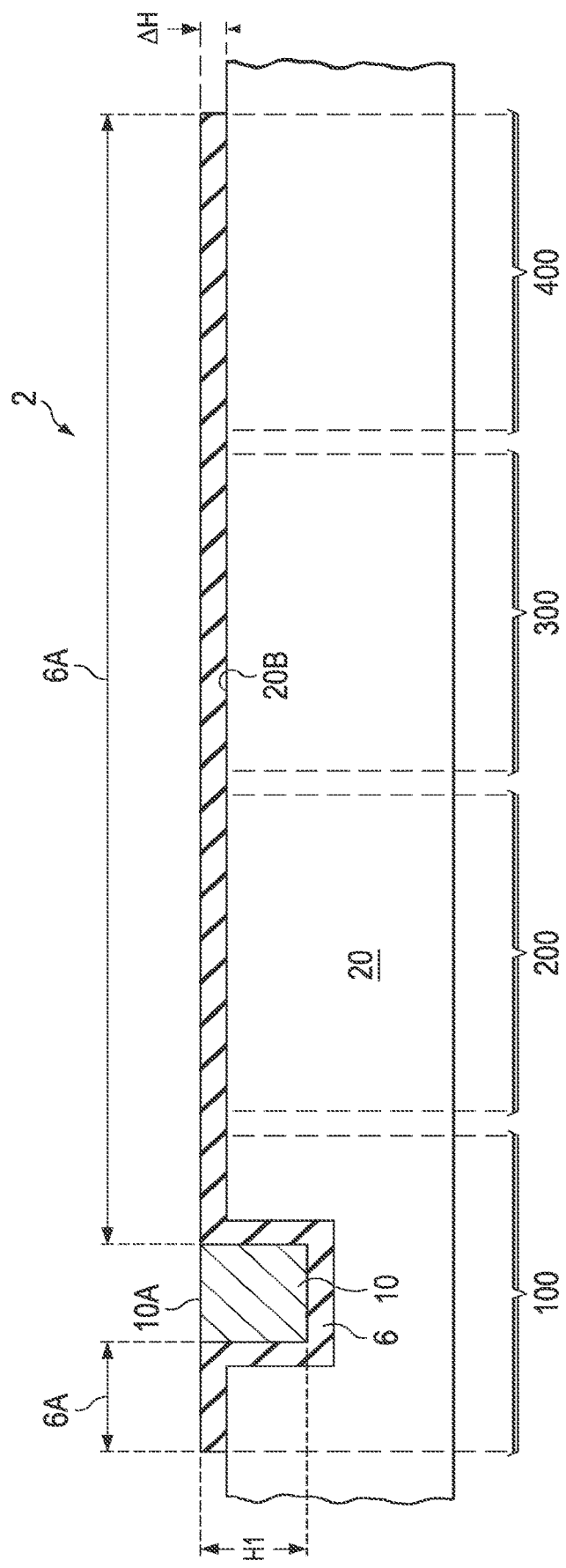

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An embedded memory device and the methods of forming the same are provided in accordance with various exemplary embodiments. The intermediate stages of forming the embedded memory device are illustrated. The variations of the embodiments are discussed. Throughout the various views and illustrative embodiments, like reference numbers are used to designate like elements.

Referring to FIG. 1, semiconductor substrate 20, which is a part of semiconductor wafer 2, is provided. In some embodiments, semiconductor substrate 20 includes crystalline silicon. Other commonly used materials such as carbon, germanium, gallium, boron, arsenic, nitrogen, indium, phosphorus, and/or the like, may also be included in semiconductor substrate 20. Semiconductor substrate 20 may be a bulk substrate or a Semiconductor-On-Insulator (SOI) substrate. In some exemplary embodiments, semiconductor substrate 20 comprises $Si_{1-z}Ge_z$, wherein value z is the atomic percentage of germanium in SiGe, and may be any value ranging from, and including, 0 and 1. For example, when value z is 0, semiconductor substrate 20 comprises a crystalline silicon substrate. When value z is 1, semiconductor substrate 20 comprises a crystalline germanium substrate. Substrate 20 may also have a compound structure including a III-V compound semiconductor on a silicon substrate, or a silicon germanium (or germanium) layer on a silicon substrate.

Semiconductor substrate 20 includes portions in regions 100, 200, 300, and 400. In accordance with some embodiments, regions 100, 200, 300, and 400 include an embedded flash memory region, a High-Voltage (HV) region, an Input/output (IO) region, and a Static Random Access Memory (SRAM) region/general logic device region, respectively. Embedded flash memory region 100 is used for forming embedded flash memory cells (such as 156 in FIGS. 18, 20, and 22) therein. HV region 200 is used for forming HV devices (such as 256 in FIG. 18) therein. IO Region 300 is used for forming IO devices (such as 356 in FIG. 18) therein. Core/SRAM Region 400 is used for forming core devices and/or SRAM cells (such as 456 in FIG. 18) therein. The core devices, sometimes referred to as logic devices, do not include any memory array therein, and may be, or may not be, in the peripheral region of SRAM arrays. For example, the core devices may be in the driver circuit or the decoder circuit of the SRAM arrays (in region 400) or the flash memory array in region 100. The HV devices are supplied with, and are configured to endure, a positive power supply voltage Vdd1 higher than the positive power supply voltage Vdd2 of the devices in region SRAM/core region 400. For example, power supply voltage Vdd2 may be lower than about 1V, and power supply voltage Vdd1 may be between about 1.5V and about 3.3V. Although portions of substrate 20 in regions 100, 200, 300, and 400 are shown as disconnected, they are portions of the same continuous substrate 20.

Referring to FIG. 2, recess 4 is formed in substrate 20, for example, by etching substrate 20. Depth Di of recess 4 is close to the thickness of the charge storage layer 10 (FIG. 5) that is to be formed in recess 4 in a subsequent step. In some exemplary embodiments, depth Di is between about 100 nm and about 200 nm, although different depths may be adopted.

As shown in FIG. 3, bottom dielectric layer 6 is formed on substrate 20. In some embodiments, bottom dielectric layer 6 is formed of silicon oxide, which may be formed by performing a thermal oxidation on substrate 20. In alternative embodiments, bottom dielectric layer 6 comprises silicon oxynitride or other dielectric materials that have low leakage of charges. In some embodiments, thickness T1 of bottom dielectric layer 6 is between about 20 Å and about 50 Å. It is appreciated, however, that the values recited throughout the description are merely examples, and may be changed to different values. In alternative embodiments, bottom dielectric layer 6 is formed through deposition. Bottom dielectric layer 6 may be a conformal layer with the vertical portions and horizontal portions having similar thicknesses, for example, with differences smaller than 20 percent of either one of the thicknesses of the vertical portions and horizontal portions.

Referring to FIG. 4, blanket charge storage layer 8 is formed. In some embodiments, charge storage layer 8 is formed of a conductive material such as polysilicon, metal, or the like. In alternative embodiments, charge storage layer 8 is formed of a dielectric material with a high trap density. In some exemplary embodiment, charge trapping layer 24 comprises silicon nitride (SiN). Charge storage layer 8 fills the unfilled portion of recess 4.

Next, referring to FIG. 5, a planarization such as a Chemical Mechanical Polish (CMP) is performed to remove excess portions of charge storage layer 8. The remaining portion of charge storage layer 8 is referred to as charge storage layer 10 (sometimes referred to as a floating gate) hereinafter. During the CMP, the portions 6A of bottom dielectric layer 6, which portions are over substrate 20, are used as a CMP stop layer. Accordingly, the top surface of charge storage layer 10 is coplanar with the top surface of portions 6A of bottom dielectric layer 6. After the CMP, the top surface 10A of charge storage layer 10 is slightly higher than top surfaces 20B of substrate portions 200/300/400, with height difference ΔH being between about 5 nm and about 50 nm, for example. In alternative embodiments, the top surface 10A of charge storage layer 10 is slightly lower than top surfaces 20B of substrate portions 200/300/400. The majority of charge storage layer 10 may be embedded in substrate 20, with a small portion over substrate 20. For example, height difference ΔH may be smaller than about 40 percent of thickness H1 of charge storage layer 10.

Figure 6:
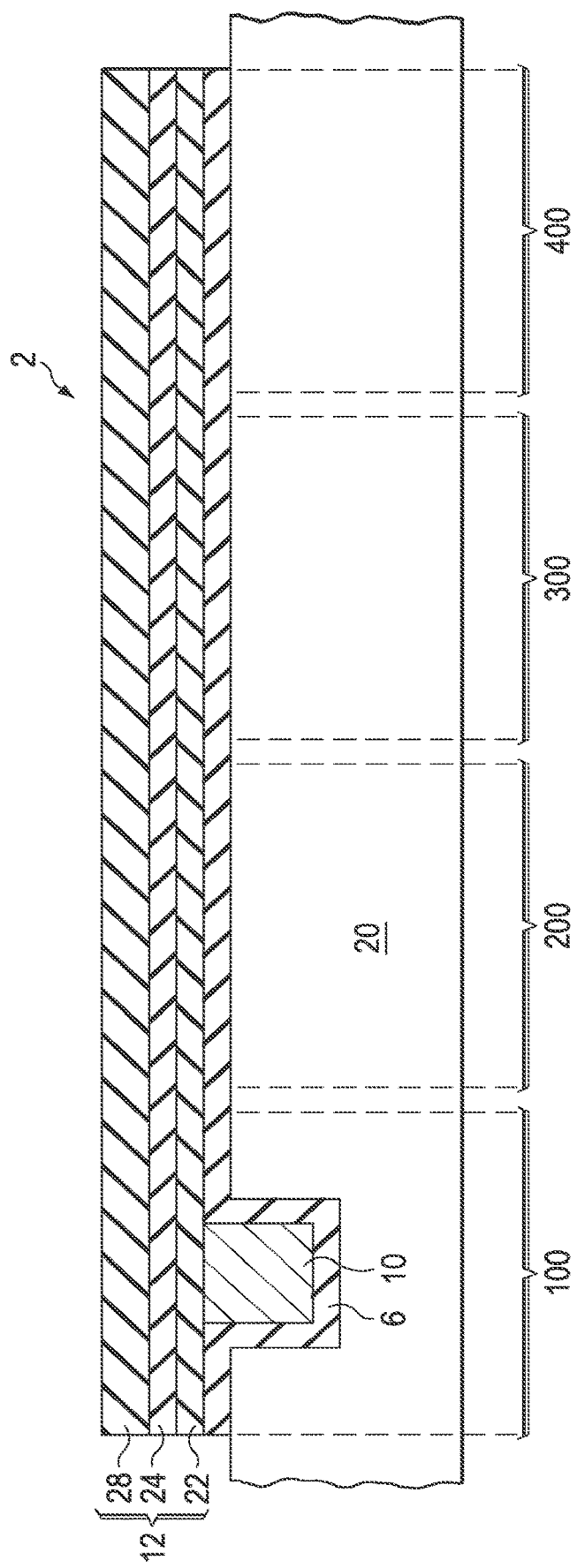

FIG. 6 illustrates the formation of top dielectric layer 12, which may be a single layer or a composite layer. In some embodiments, top dielectric layer 12 is a single layer, which may be a silicon oxide layer, a silicon oxynitride layer, or the like. In alternative embodiments, top dielectric layer 12 is a composite layer comprising a plurality of dielectric layers. For example, FIG. 6 illustrates that dielectric layer 12 has a triple-layer structure, which may include an Oxide-Nitride-Oxide (ONO) structure, with layers 22, 24, and 28 being a silicon oxide layer, a silicon nitride layer, and a silicon oxide layer, respectively.

Referring to FIG. 7, bottom dielectric layer 6 and top dielectric layer 12 are patterned in an etching step. The portions of bottom dielectric layer 6 and top dielectric layer 12 are removed from regions 200, 300, and 400. The portion of bottom dielectric layer 6 and top dielectric layer 12 in region 100 are left un-removed. After the patterning, as shown in FIG. 8, HV dielectric layer 26 is formed in regions 200, 300, and 400. Thickness T2 of HV dielectric layer 26 may be between about 50 Å and about 300 Å.

In accordance with some embodiments, HV dielectric layer 26 is formed using thermal oxidation by oxidizing substrate 20. Accordingly, HV dielectric layer 26 is formed in regions 200, 300, and 400, and not in region 100. In alternative embodiments, HV dielectric layer 26 is formed using a Chemical Vapor Deposition (CVD) method such as Plasma Enhance CVD (PECVD), Low Pressure CVD (LPCVD), Atomic Layer Deposition (ALD), or the like. In these embodiments, HV dielectric layer 26 may comprise silicon oxide, silicon oxynitride, or the like. The dielectric constant of the HV dielectric layer 26 and dielectric layer 28 may be about 3.8 in some embodiments.

As shown in FIG. 9, HV dielectric layer 26 is patterned, and is removed from regions 300 and 400. Next, Referring to FIG. 10, IO dielectric layer 30 is formed. In some embodiments, IO dielectric layer 30 comprises silicon oxide. Alternatively, IO dielectric layer 30 comprises silicon oxynitride. Thickness T3 of IO dielectric layer 30 may be between about 20 Å and about 70 Å, which may be smaller than thickness T2 of HV dielectric layer 26 in some embodiments. Similarly, IO dielectric layer 30 may be formed through thermal oxidation of substrate 20, deposition, or the like. After the formation of IO dielectric layer 30, IO dielectric layer 30 is removed from region 400.

Referring to FIG. 11, interfacial layer 32 is formed on substrate 20. Interfacial layer 32 may comprise a chemical oxide, a thermal oxide, or the like. In some embodiments, interfacial layer 32 is formed by oxidizing the exposed surface portion of substrate 20. In alternative embodiments, interfacial layer 32 is formed by treating the surface portion of substrate 20 using a chemical, for example, an oxidant such as ozone water or hydrogen peroxide. The resulting interfacial layer 32 is referred to as a chemical oxide layer, which comprises silicon oxide. Thickness T4 of interfacial layer 32 may be between about 8 Å and about 20 Å, which may be smaller than thickness T3 of IO dielectric layer 30 in some embodiments.

Figure 12:
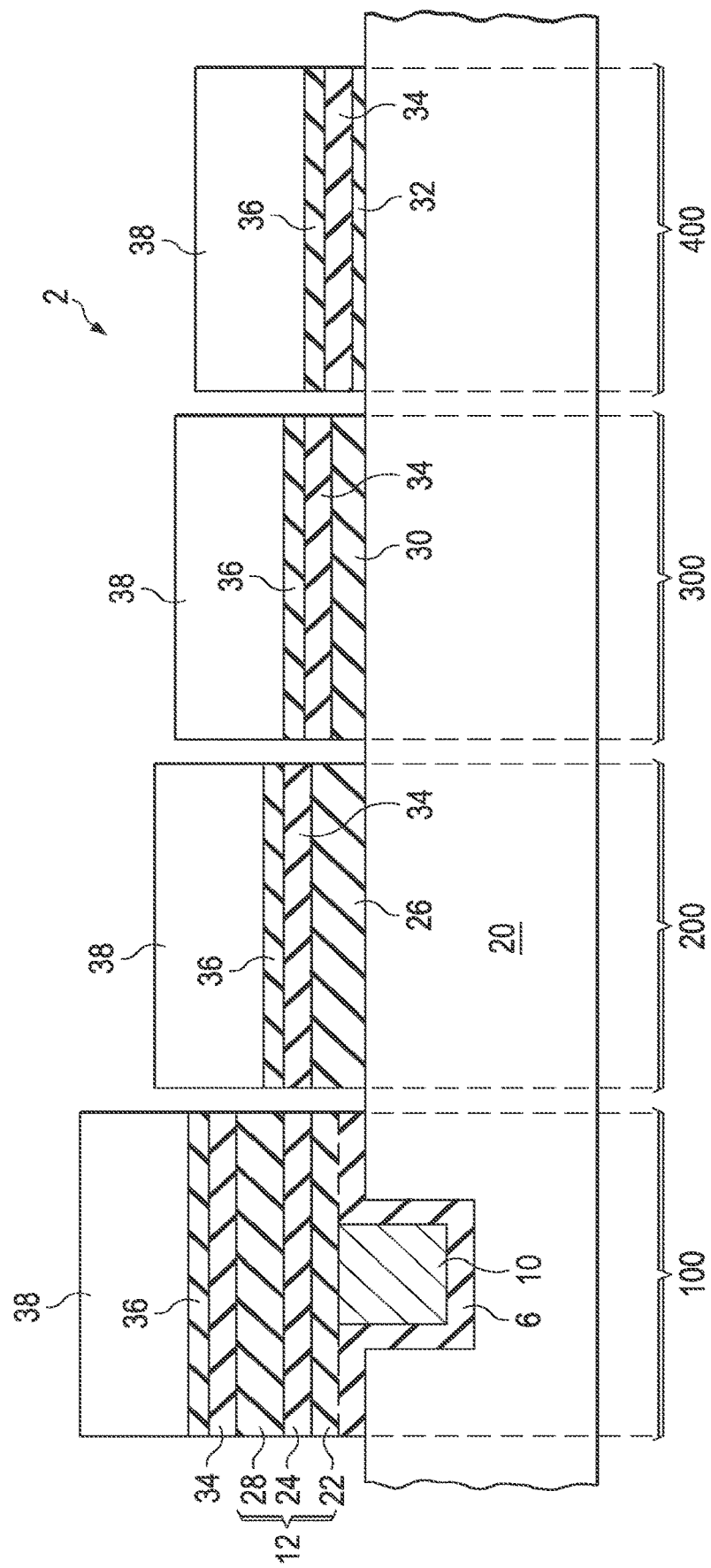

Referring to FIG. 12, high-k dielectric layer 34, capping layer 36, and dummy gate layer 38 are formed sequentially, and are formed in regions 100, 200, 300, and 400 simultaneously. Accordingly, each of layers 34, 36, and 38 has a same thickness and a same material in regions 100, 200, 300, and 400. Dummy gate layer 38 may be formed of polysilicon in some exemplary embodiments. High-k dielectric layer 34 may have a k value greater than about 7.0, and may include an oxide or a silicate of Hf, Al, Zr, La, Mg, Ba, Ti, Pb, Yb, Pr, Nd, Gd, Er, Dy, or combinations thereof. Exemplary materials of high-k dielectric layer 34 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The thickness of high-k dielectric layer 34 may be between about 0.5 nm and about 10 nm. The formation methods of high-k dielectric layer 34 may include Molecular-Beam Deposition (MBD), Atomic Layer Deposition (ALD), Physical Vapor Deposition (PVD), and the like.

Over high-k dielectric layer 34, capping layer 36 may be formed. In some embodiments, capping layer 36 comprises titanium nitride (TiN). In alternative embodiments, the exemplary materials of capping layer 36 include tantalum-containing materials and/or titanium-containing materials such as TaC, TaN, TaAlN, TaSiN, and combinations thereof. Dummy gate layer 38 is then formed over capping layer 36.

Figure 13:
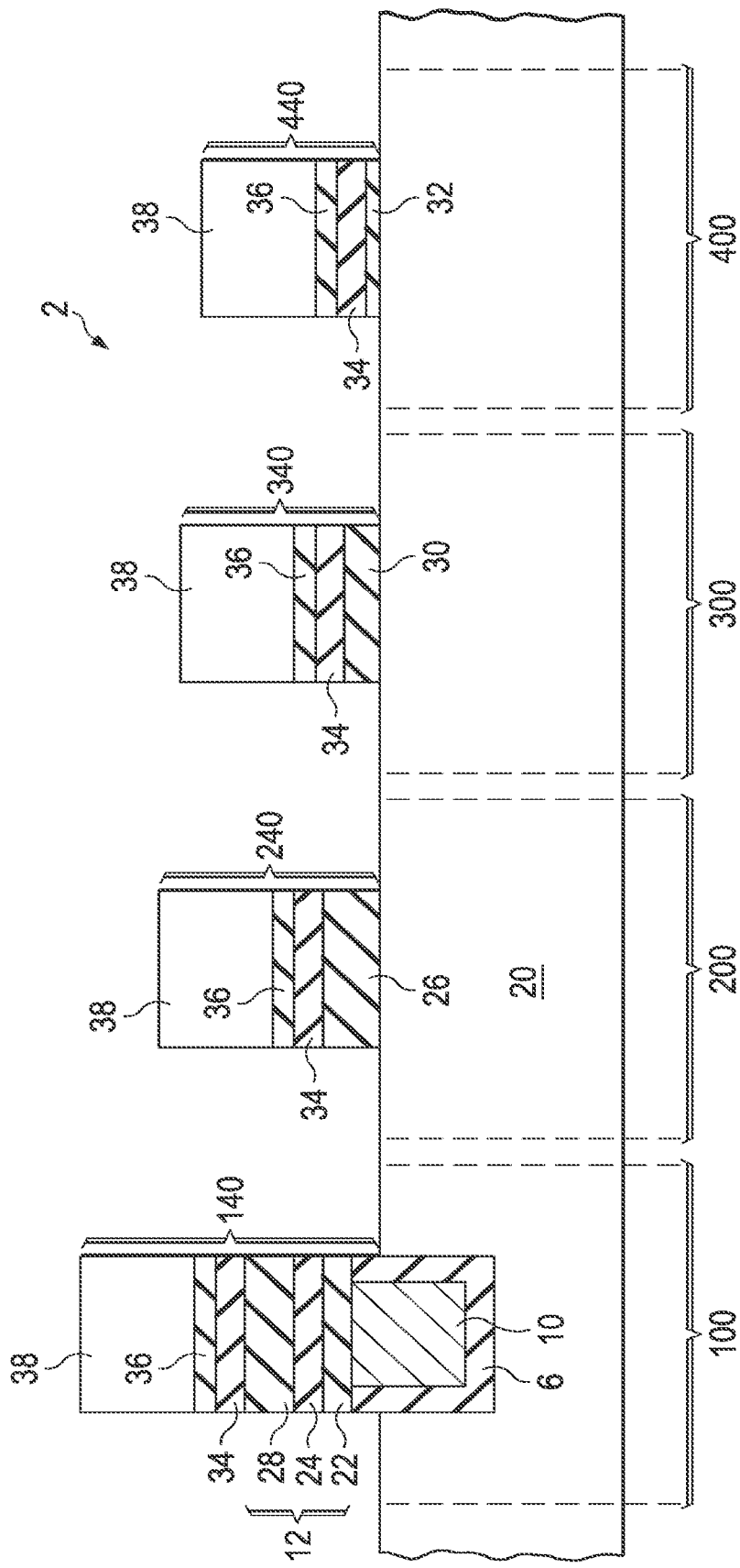

FIGS. 13 through 18 illustrate the formation of devices in regions 100, 200, 300, and 400 using a gate-last approach, wherein the gates of the devices are referred to as replacement gates. Referring to FIG. 13, layers 12, 26, 30, 32, 34, 36, and 38 are patterned, forming layer stacks 140, 240, 340, and 440 in regions 100, 200, 300, and 400, respectively. After the patterning, lightly doped source and drain regions (not shown) and/or packet regions (not shown) may be formed adjacent to either one or all layer stacks 140, 240, 340, and 440.

Figure 14:
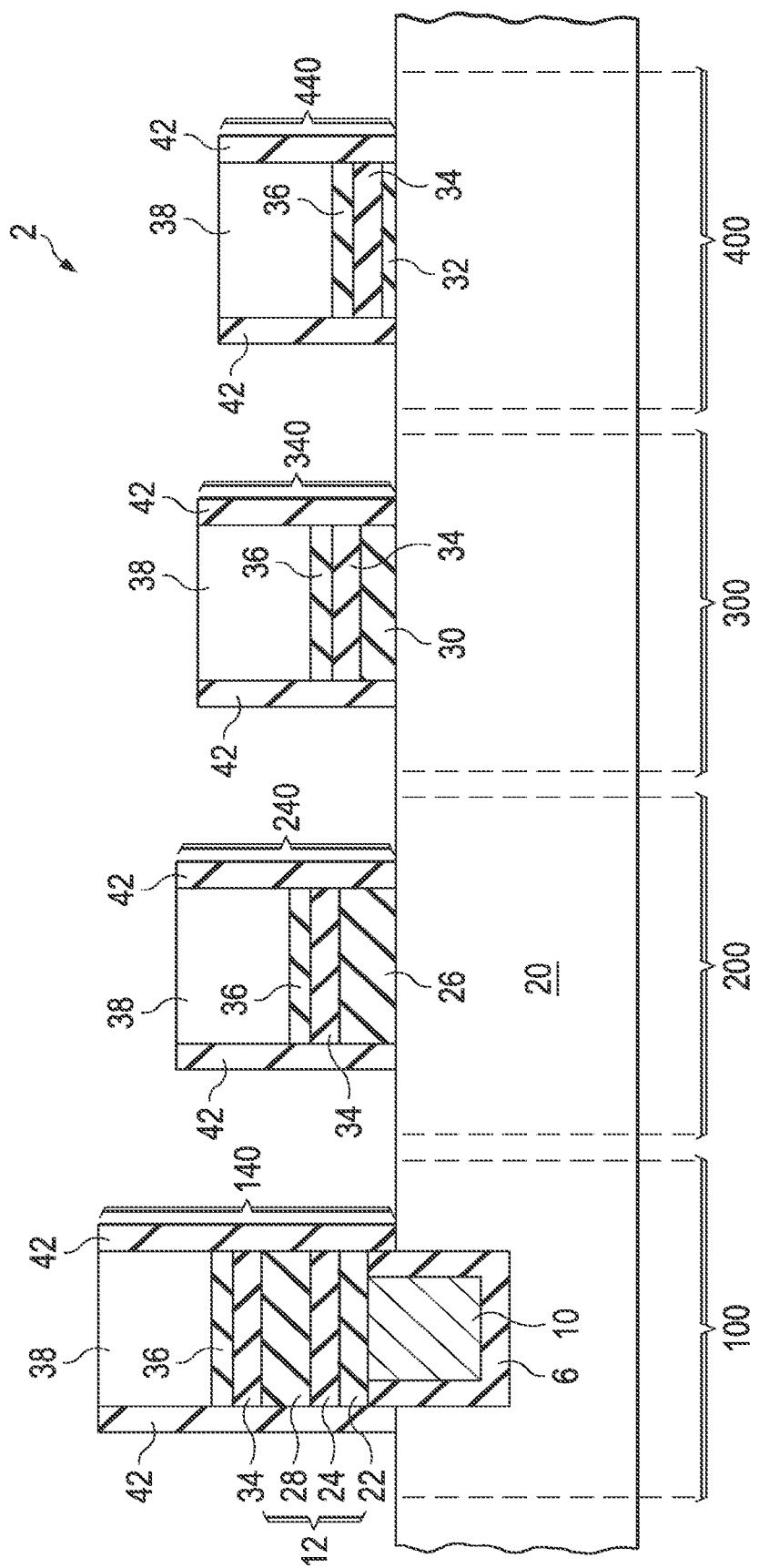

Next, referring to FIG. 14, gate spacers 42 are formed on the sidewalls of layer stacks 140, 240, 340, and 440. In some embodiments, gate spacers 42 comprise silicon nitride, although other dielectric materials may also be used. The formation of gate spacers 42 includes forming a blanket layer(s), and performing an anisotropic etching to remove the horizontal portions of the blanket layer. The remaining portions of the blanket layer form gate spacers 42.

Figure 15:
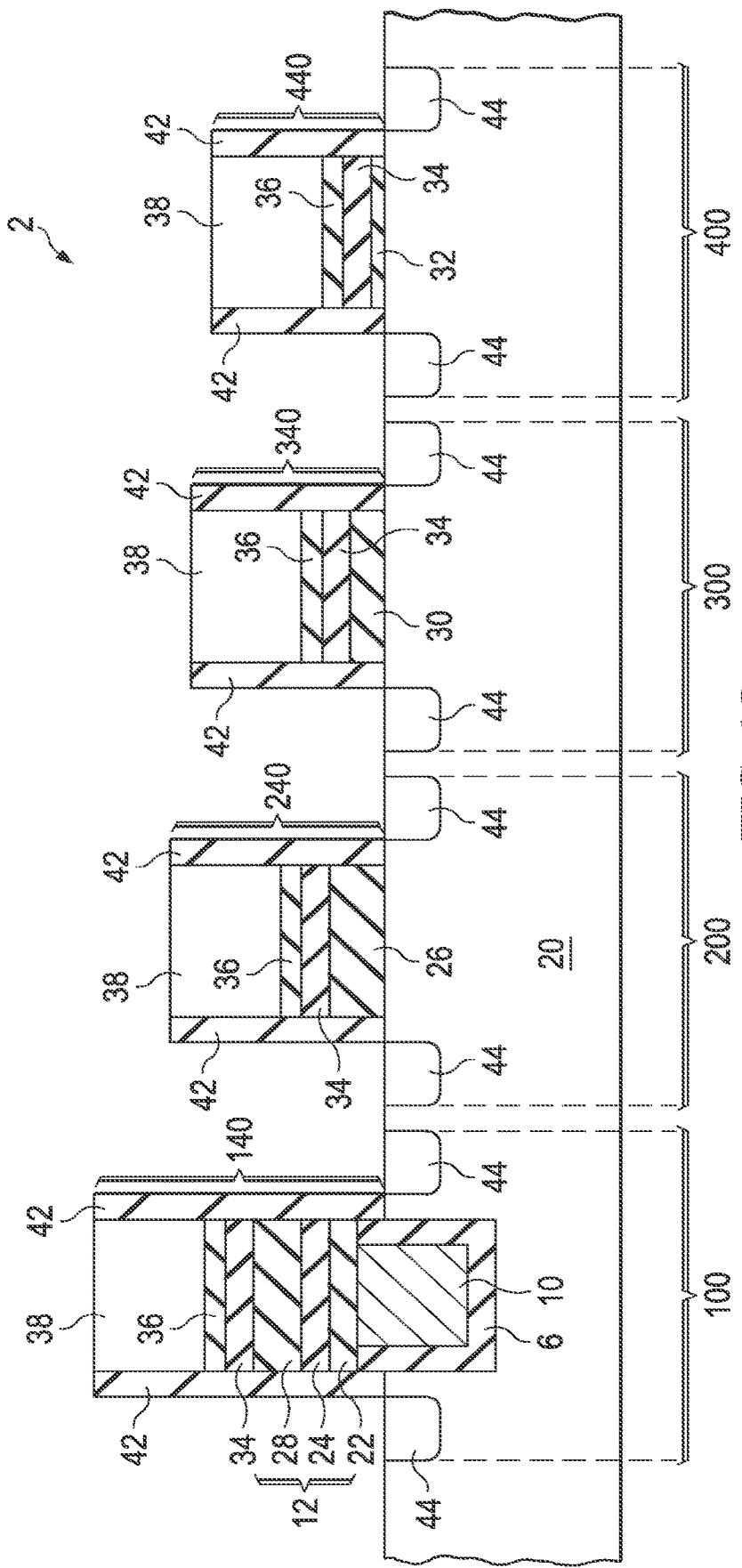

FIG. 15 illustrates the formation of source and drain regions 44, which are alternatively referred to as a source/drain regions 44 hereinafter. Source/drain regions 44 may be formed through implantation or epitaxy. The formation details of source/drain regions 44 are not discussed herein.

Figure 16:
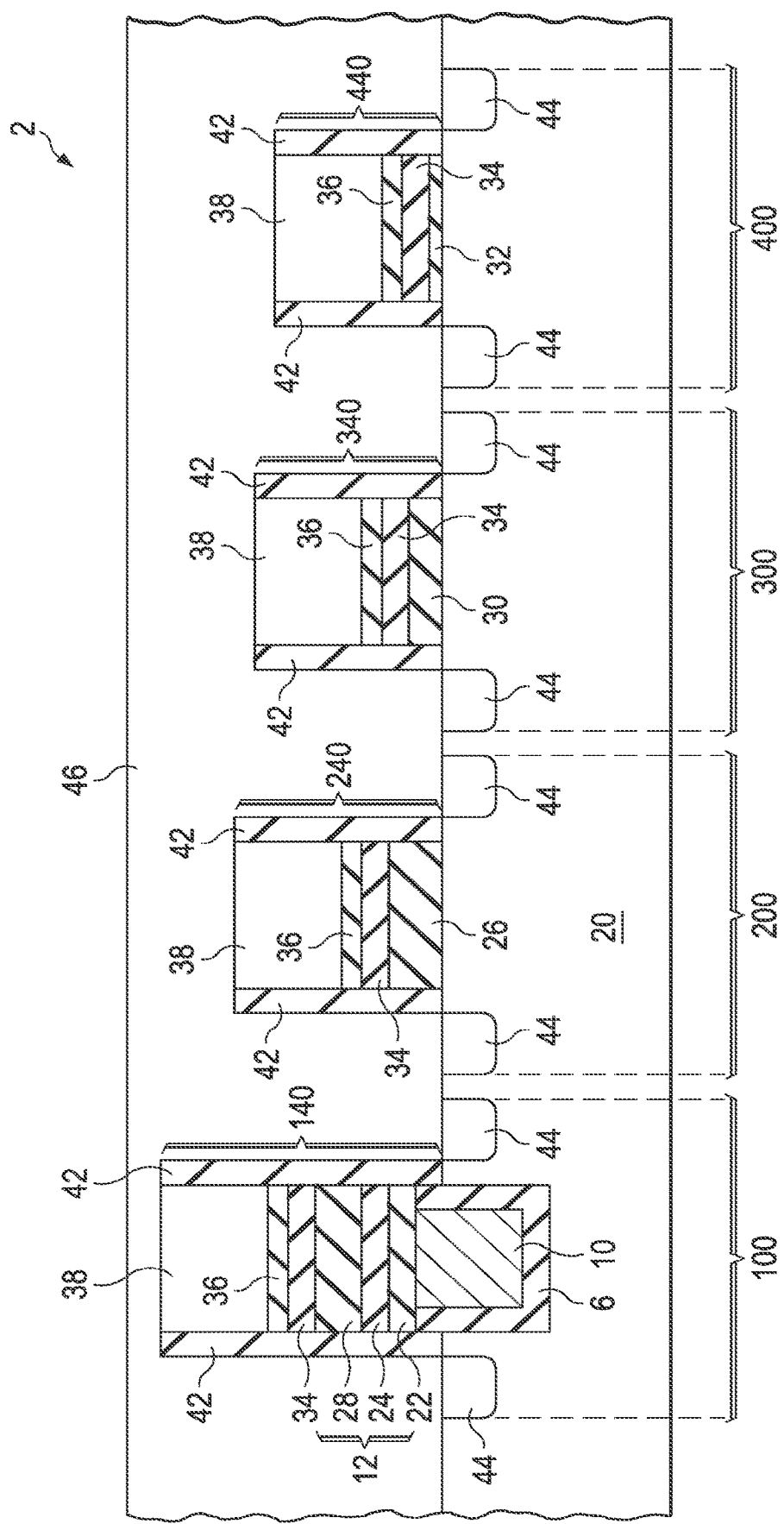
Figure 17:
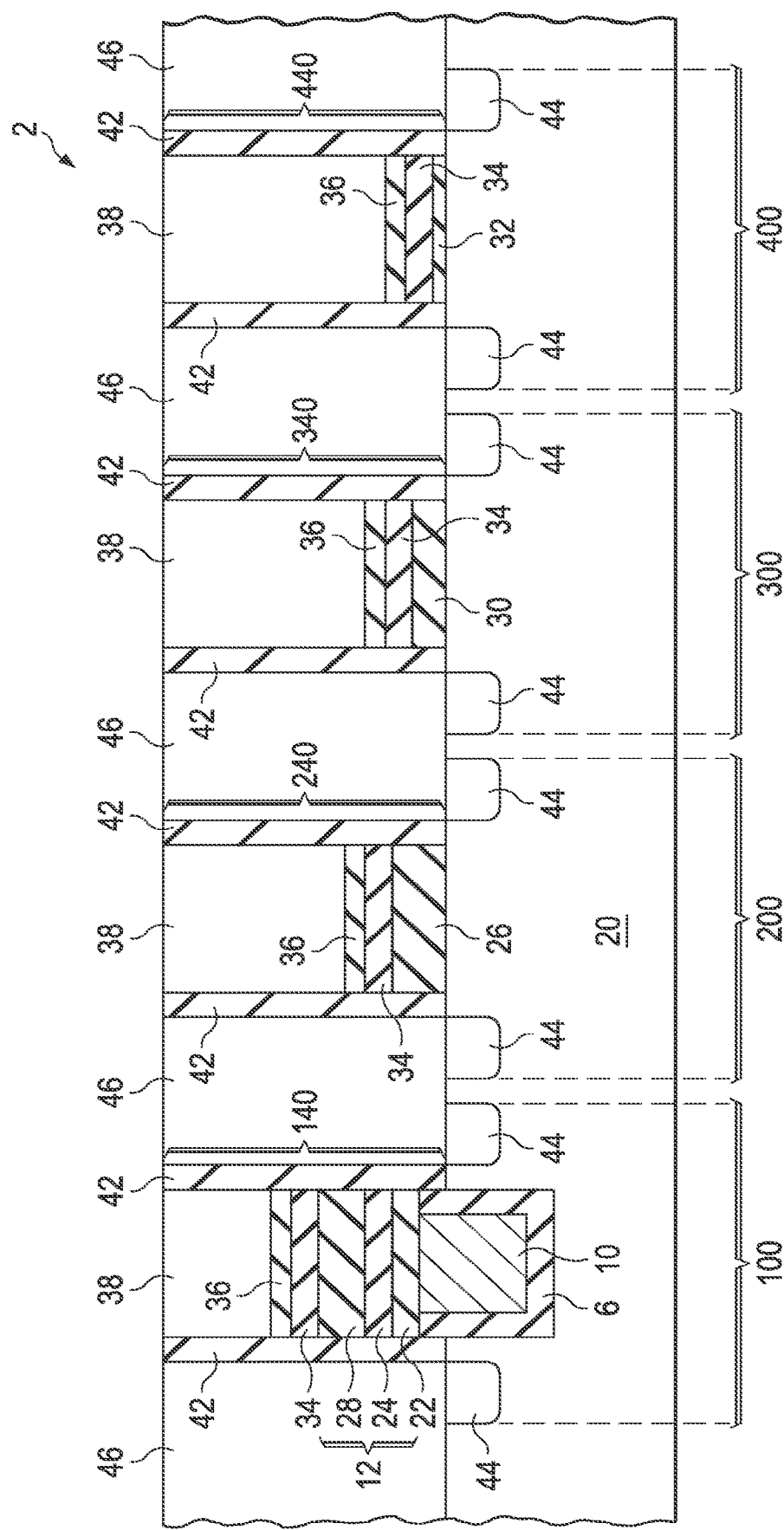

FIG. 16 illustrates the formation of Inter-Layer Dielectric (ILD) 46, which is formed of a dielectric material such as Phospho-Silicate Glass (PSG), Boro-Silicate Glass (BSG), Boron-Doped Phospho-Silicate Glass (BPSG), or the like. ILD 46 has a top surface higher than the top surface of layer stacks 140, 240, 340, and 440. A CMP may then be performed to level the top surface of ILD 46 and the top surfaces of the layer stacks, as shown in FIG. 17.

Figure 18:
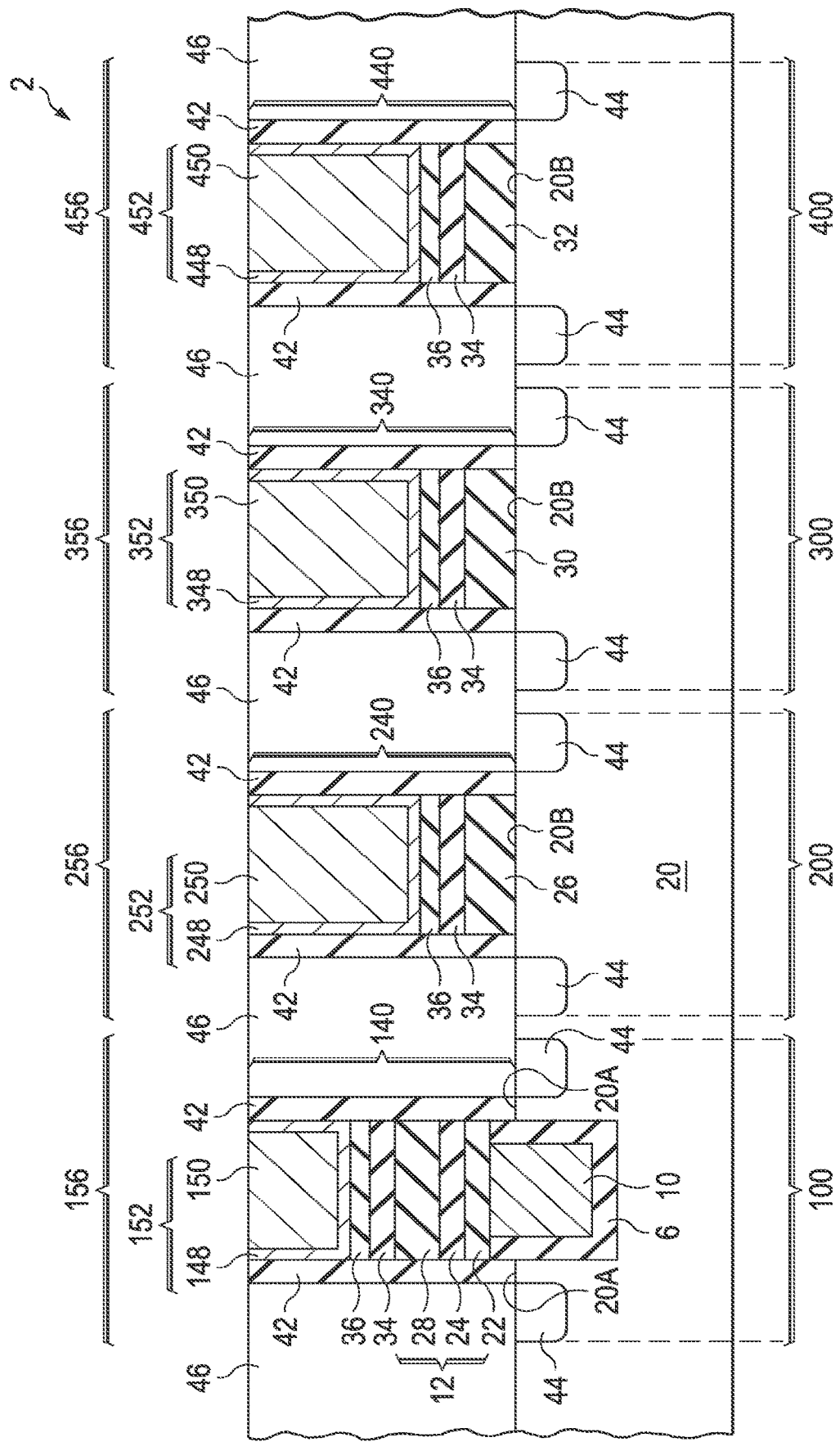

Referring to FIG. 18, the remaining portions of polysilicon layer 38 (FIG. 17) are removed, for example, through etching, and are replaced with replacement gates. The replacement gates include metal gate electrodes 152, 252, 352, and 452. Metal gate electrodes 152, 252, 352, and 452 may have a single layer structure or a multi-layer structure including a plurality of layers, which is schematically illustrated using reference notations 148 and 150. Metal gate electrode 152 forms the gate electrode of embedded flash memory 156. Metal gate electrode 252 forms the gate electrode of HV device (transistor) 256. Metal gate electrode 352 forms the gate electrode of IO device (transistor) 356. Metal gate electrode 452 forms the gate electrode of core or SRAM device (transistor) 456. Gate electrodes 152, 252, 352, and 452 may comprise metal or metal alloys such as Cu, W, Co, Ru, Al, TiN, TaN, TaC, combinations thereof, and multi-layers thereof. As shown in FIG. 18, the top surface of metal gate 152 is coplanar with the top surfaces of metal gates 252, 352, and 452 due to the CMP. The bottom surface of metal gate 152 is higher than the bottom surfaces of metal gates 252, 352, and 452.

In subsequent steps, contact openings (not shown) are formed in ILD 46, exposing underlying source/drain regions 44. Source/drain silicides and sourced/drain contact plugs (not shown) may be formed to electrically couple to source/drain regions 44. The formation of memory device 156, HV transistor 256, IO transistor 356, and core/SRAM transistor 456 is thus finished.

Figure 19:
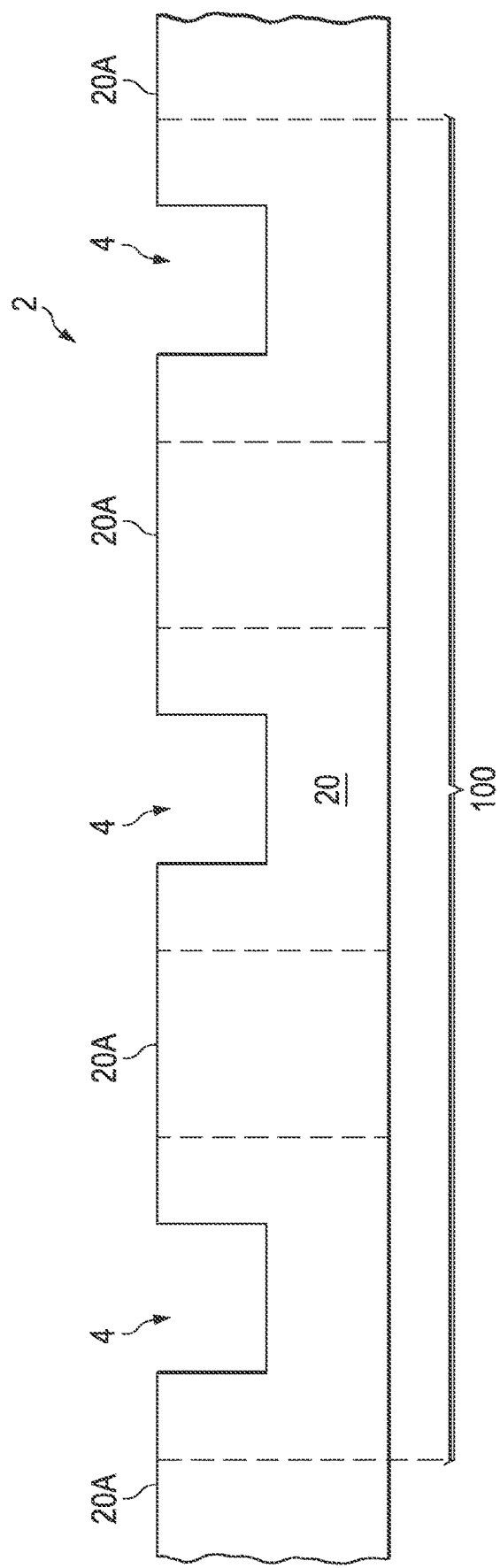
FIGS. 19 and 20 are cross-sectional views of intermediate stages in the manufacturing of embedded memory devices in accordance with some exemplary embodiments, wherein the charge storage layers of a plurality of embedded memory devices are formed in discrete recesses.

In memory region 100, there may be a plurality of memory devices having the same structure, for example, the structure of memory device 156 in FIG. 18. The plurality of memory devices 156 may be arranged as an array including a plurality of rows and columns of the flash memory devices. FIG. 19 illustrates a cross-sectional view of device region 100, in which a plurality of memory devices 156 is to be formed. In accordance with some embodiments, in the recessing of substrate 20, which recessing step is shown in FIG. 2, discrete recesses 4 are formed. The discrete recesses 4 may form an array in the top view of the structure in FIG. 19. Each of the recesses 4 is used to form the charge storage layer of one of the embedded flash memory devices. The portions of substrate 20 between discrete recesses 4 are not etched, and hence have top surfaces 20A higher than the bottom surfaces of recesses 4.

Figure 20:
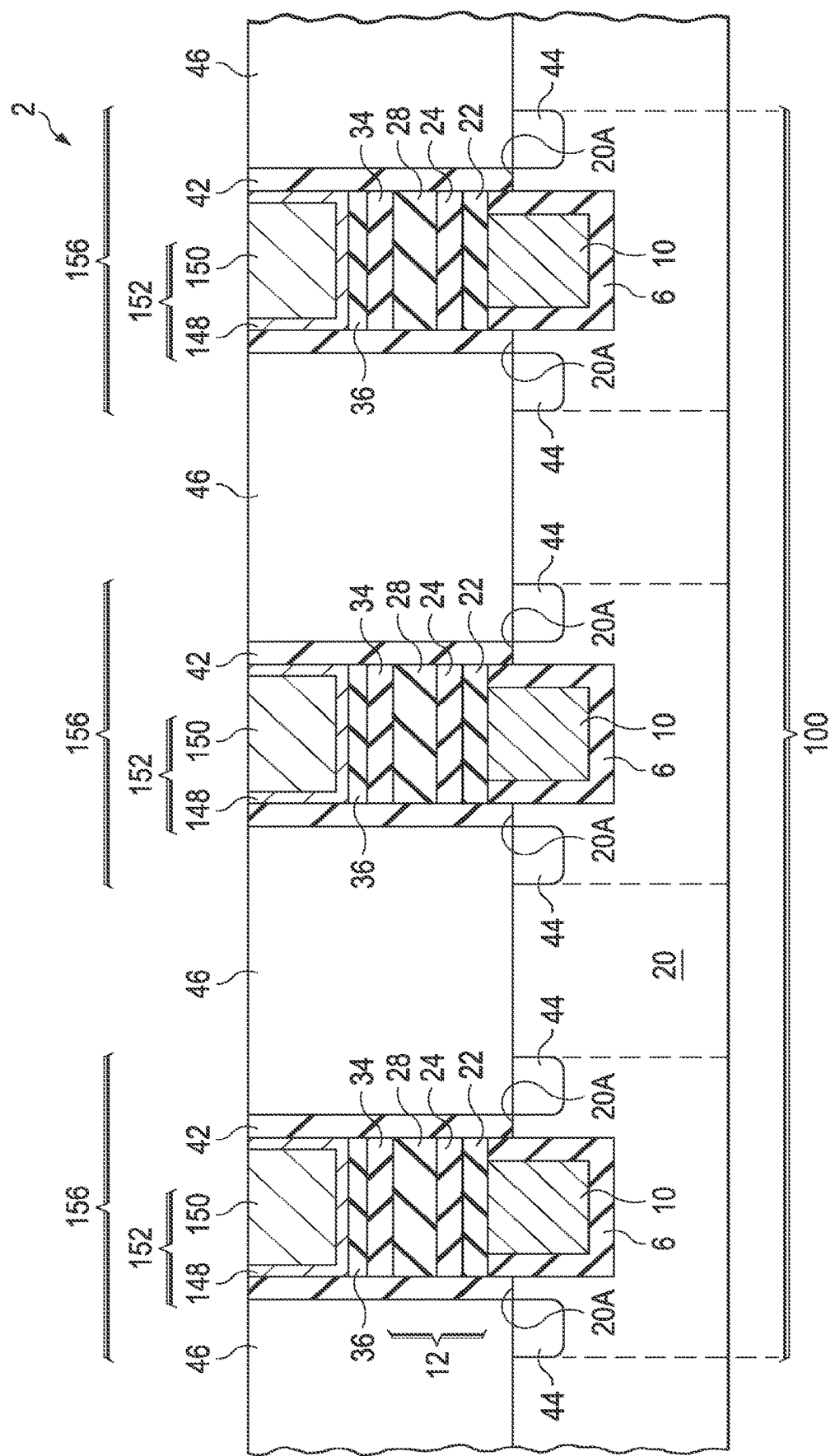

In subsequent steps in accordance with these embodiments, the process steps shown in FIGS. 3 through 18 are performed to form a plurality of memory devices 156, and the resulting structure is shown in FIG. 20. Devices 256, 356, and 456 are not shown in FIG. 20, and are the same as in FIG. 18. As shown in FIG. 20, charge storage layers 10 and the respective bottom dielectric layers 6 are formed in discrete recesses 4 (FIG. 19) in substrate 20. Substrate 20 thus includes un-etched portions on opposite sides of, and adjacent to, each of charge storage layers 10. In these embodiments, in device region 100, some portions of substrate 20 between neighboring devices 156 may have top surfaces 20A (also shown in FIG. 18) that are coplanar with the top surfaces 20B (FIG. 18) of the portions of substrate 20 in regions 200, 300, and 400.

Figure 21:
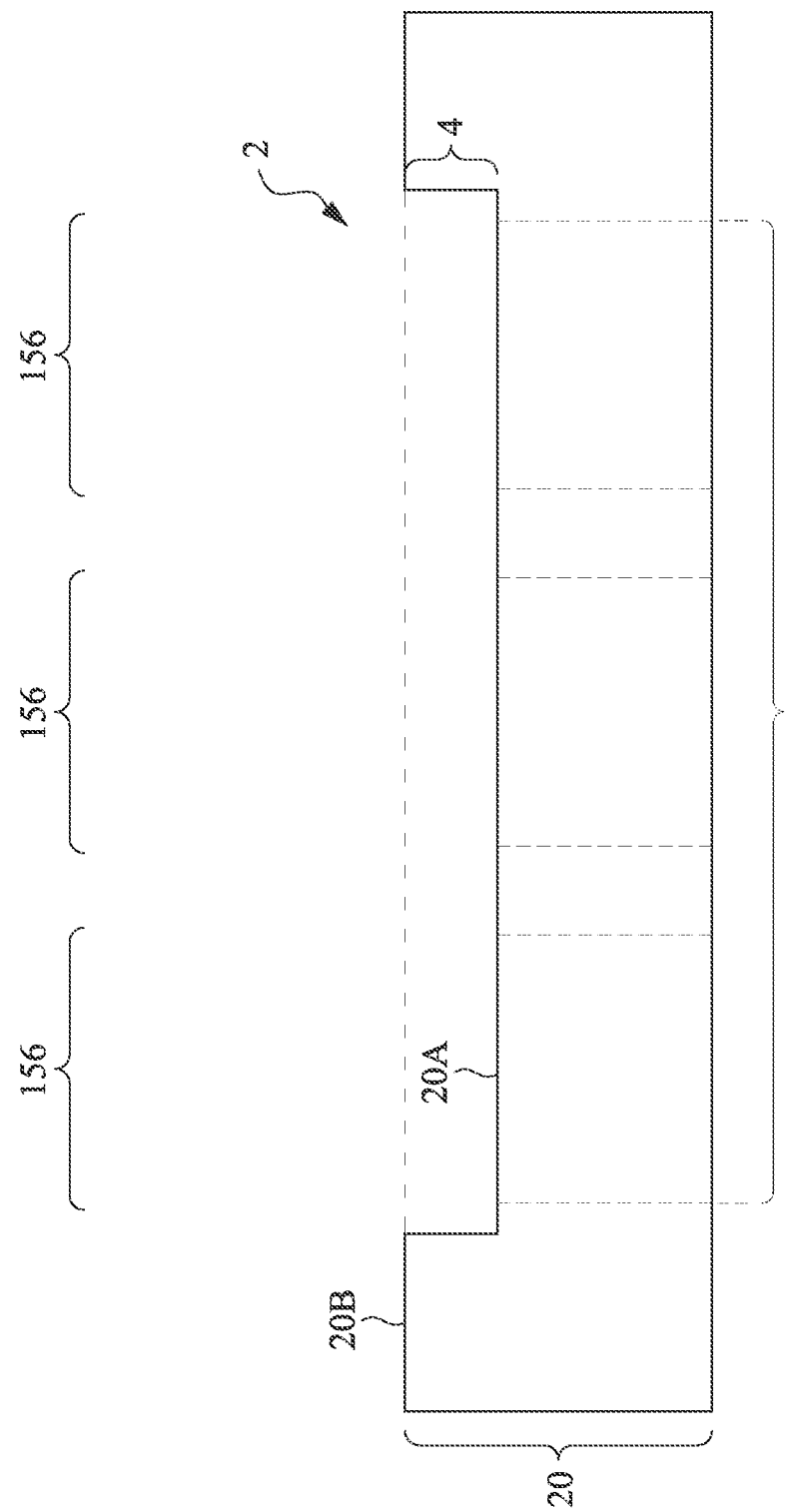
FIGS. 21 and 22 are cross-sectional views of intermediate stages in the manufacturing of embedded memory devices in accordance with some exemplary embodiments, wherein the charge storage layers of a plurality of embedded memory devices are formed in a same continuous recess.

In accordance with alternative embodiments, instead of forming discrete recesses in order to place charge storage layers, the portions of semiconductor substrate between recesses 4, which are used for forming charge storage layers 10 in, are also etched. Hence, the entirety of the substrate 20 in device region 100, at which a memory array is to be formed, is recessed. FIG. 21 illustrates a cross-sectional view of device region 100 and recess 4, in which a plurality of memory devices 156 is to be formed. In accordance with some embodiments, in the recessing of substrate 20, which step is shown in FIG. 2, a block of substrate in device region 100 is recessed. Dashed line 20B illustrates where the top surface of substrate 20 was before the recessing. The level represented by 20B is also the level of the top surfaces of the portions of substrate 20 in regions 200, 300, and 400 (FIG. 18). The recessed top surface of the portion of substrate 20 in region 100 is marked as 20A, which is lower than 20B.

Figure 22:
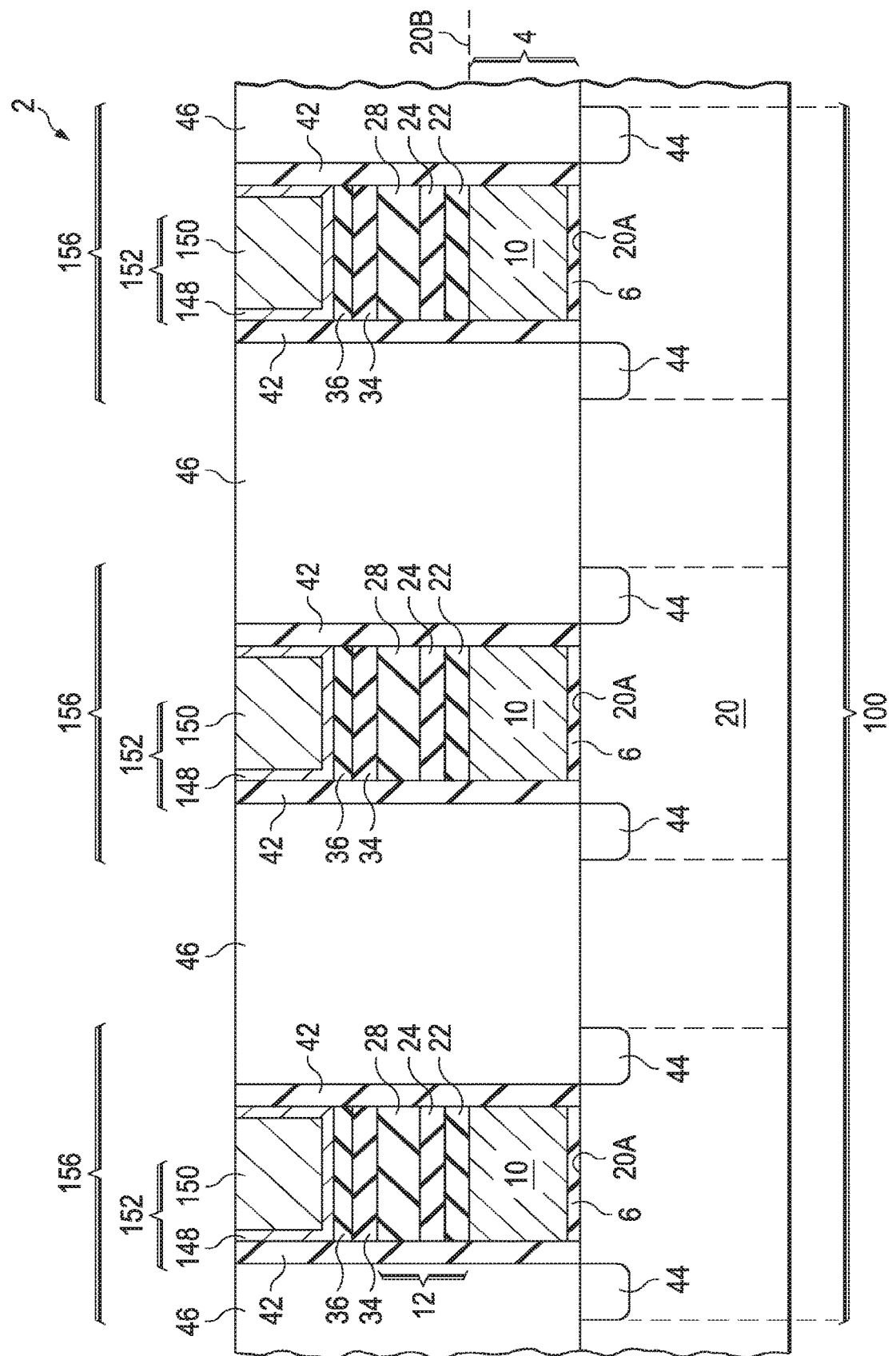

In subsequent steps in accordance with these embodiments, the process steps shown in FIGS. 3 through 18 are performed to form a plurality of memory devices 156, and the resulting structure is shown in FIG. 22. Devices 256, 356, and 456 are not shown in FIG. 22, and are the same as in FIG. 18. As shown in FIG. 22, charge storage layers 10 and the respective bottom dielectric layers 6 are formed in recess 4 that extends throughout a plurality of memory devices 156. Substrate 20 in these embodiments does not include portions on opposite sides of, and adjacent to, each of charge storage layers 10. Rather, in device region 100, charge storage layers 10 and bottom dielectric layers 6 are over top surface 20A, which is lower than top surface 20B of the portions of substrate 20 in regions 200/300/400 (FIG. 18), wherein top surfaces 20B are also shown in FIG. 18.

In accordance with the embodiments of the present disclosure, in the embedded flash memory 156 (FIGS. 13 and 16), floating gates are formed at least partially in substrate 20. Since floating gates have great thicknesses, if floating gates are formed over the substrate, the gate stacks of the embedded flash memory devices will be much higher than the gate stacks of other transistors such as HV transistors, IO transistors, and core/SRAM transistors. This incurs process difficulty. For example, the CMP in the formation of replacement gates cannot be performed because this may cause the entire dummy gates of the embedded flash memory devices to be removed in the CMP. By embedding the floating gates of the flash memory devices in the substrates, the heights of the gate stacks of the flash memory devices are reduced, and the subsequent CMP may be performed.

In addition, high-k dielectric layer 34 is formed over the top dielectric layer 12 to form the blocking layer of the resulting embedded flash memory 156. With the dual layer structure of the blocking layer, the thickness of the high-k dielectric and the top dielectric layer may be reduced without sacrificing the charge retention ability of the memory devices. On the other hand, with the formation of the metal gates in the memory device 156, the mismatch between the threshold voltages of different embedded flash memory devices is reduced. This is advantageous for the formation of flash memory devices having different threshold voltage levels. With small mismatch, different levels of threshold voltages may be clearly distinguished from each other.

In accordance with some embodiments, an embedded flash memory device includes a gate stack, which includes a bottom dielectric layer extending into a recess in a semiconductor substrate, and a charge storage layer over the bottom dielectric layer. The charge storage layer includes a portion in the recess. The gate stack further includes a top dielectric layer over the charge storage layer, and a metal gate over the top dielectric layer. Source and drain regions are in the semiconductor substrate, and are on opposite sides of the gate stack.

In accordance with other embodiments, a gate stack of an embedded flash memory device includes a bottom silicon oxide layer extending on sidewalls and a bottom of a recess in the semiconductor substrate, and a charge storage layer over the bottom silicon oxide layer. A majority of the charge storage layer is embedded in the recess. The gate stack further includes a top oxide layer over the charge storage layer, a high-k dielectric layer over and contacting the top oxide layer, a metal capping layer over and contacting the high-k dielectric layer, and a metal gate over the high-k dielectric layer.

In accordance with yet other embodiments, a method includes recessing a semiconductor substrate to form a recess in a device region of the semiconductor substrate, forming a bottom dielectric layer, wherein the bottom dielectric layer extends on sidewalls and a bottom surface of the recess, forming a charge storage layer over the bottom dielectric layer, wherein a portion of the charge storage layer is in the recess, forming a top dielectric layer over the charge storage layer, forming a metal gate over the top dielectric layer, and forming source and drain regions in the semiconductor substrate and on opposite sides of the charge storage layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    etching a semiconductor substrate to form a recess extending into a first region of the semiconductor substrate; and
    forming a first transistor in the first region and a second transistor in a second region of the semiconductor substrate, forming the first transistor and the second transistor comprising:
        forming a bottom dielectric layer in the first region and the second region, a portion of the bottom dielectric layer being in the recess;
        forming a charge storage layer over the bottom dielectric layer in the first region and the second region, a portion of the charge storage layer being in the recess;
        removing the charge storage layer from the second region, the portion of the charge storage layer being level with an upper surface of the bottom dielectric layer;
        forming a top dielectric layer directly over the charge storage layer and the bottom dielectric layer in the first region and the second region;
        removing the top dielectric layer and the bottom dielectric layer from the second region to expose the semiconductor substrate;
        forming an oxide layer over the second region of the semiconductor substrate;
        forming a high-k dielectric layer over the top dielectric layer and the oxide layer;
        forming a gate layer over the high-k dielectric layer;
        patterning from the gate layer to the semiconductor substrate to form a first stack in the first region and a second stack in the second region; and
        forming a first gate spacer along a first sidewall of the first stack and a second gate spacer along a second sidewall of the second stack, the first gate spacer being in physical contact with the bottom dielectric layer and the top dielectric layer.

2. The method of claim 1, wherein after forming the bottom dielectric layer, a portion of the bottom dielectric layer in the first region comprises:
    a first horizontal portion over a top surface of the semiconductor substrate;
    a second horizontal portion in the recess; and
    a vertical portion connecting the first horizontal portion with the second horizontal portion.

3. The method of claim 1, further comprising forming a source region and a drain region in the semiconductor substrate and on opposite sides of the charge storage layer, wherein both a first bottom of the source region and a second bottom of the drain region are higher than a bottom surface of the charge storage layer.

4. The method of claim 1, wherein forming the first gate spacer and the second gate spacer comprises:
    depositing a gate spacer layer over and along the first sidewall of the first stack and the second sidewall of the second stack; and
    anisotropically etching the gate spacer layer to form the first gate spacer along the first sidewall and the second gate spacer along the second sidewall.

5. The method of claim 1, further comprising:
    removing the gate layer from the first region and the second region;
    forming a first replacement gate over the high-k dielectric layer in the first region; and forming a second replacement gate over the high-k dielectric layer in the second region.

6. The method of claim 1, wherein the top dielectric layer comprises an oxide-nitride-oxide structure.

7. The method of claim 1, further comprising, after forming the oxide layer over the second region, forming an additional oxide layer over a third region of the semiconductor substrate, wherein the additional oxide layer is different from the top dielectric layer and the oxide layer.

8. The method of claim 7, wherein forming the high-k dielectric layer comprises forming the high-k dielectric layer over the additional oxide layer, wherein patterning from the gate layer to the semiconductor substrate comprises forming a third stack in the third region, and wherein the third stack is part of a third transistor.

9. A method comprising:
 etching a semiconductor substrate to form a recess in a first transistor region of the semiconductor substrate, the semiconductor substrate comprising a second transistor region remaining non-recessed;
 depositing a bottom dielectric layer over the semiconductor substrate, the bottom dielectric layer comprising a first upper surface in the recess and a second upper surface in the second transistor region;
 forming a charge storage layer along the first upper surface and the second upper surface of the bottom dielectric layer;
 removing the charge storage layer from the second upper surface, a third upper surface of the charge storage layer being level with the second upper surface;
 forming a top dielectric layer along the third upper surface and the second upper surface;
 removing the top dielectric layer and the bottom dielectric layer from the second transistor region;
 forming an oxide layer over the semiconductor substrate in the second transistor region;
 forming a high-k dielectric layer along upper surfaces of the top dielectric layer and the oxide layer;
 forming a gate layer over the high-k dielectric layer;
 etching the gate layer, the high-k dielectric layer, the top dielectric layer, the oxide layer, and the bottom dielectric layer to expose the semiconductor substrate in the first transistor region and the second transistor region;
 forming a first gate spacer along the top dielectric layer in the first transistor region; and
 forming a second gate spacer along the oxide layer in the second transistor region.

10. The method of claim 9, wherein the top dielectric layer comprises:
 a bottom oxide layer;
 a nitride layer over the bottom oxide layer; and
 a top oxide layer over the nitride layer.

11. The method of claim 9, wherein the first gate spacer physically contacts an interface between the top dielectric layer and the bottom dielectric layer.

12. The method of claim 9, wherein the second gate spacer physically contacts an interface between the oxide layer and the high-k dielectric layer.

13. The method of claim 9, further comprising:
 forming an inter-layer dielectric over the first transistor region and the second transistor region; and
 removing the gate layer from over the first transistor region and the second transistor region.

14. The method of claim 13, further comprising:
 forming a first replacement gate over the first transistor region; and
 forming a second replacement gate over the second transistor region.

15. A method of forming transistors comprising:
 forming a recess in a first region of a semiconductor substrate, the first region being a location to form a first transistor, the semiconductor substrate comprising a second region, the second region being a location to form a second transistor;
 depositing a bottom dielectric layer of the first transistor over the semiconductor substrate in the first region and the second region;
 forming a charge storage layer of the first transistor over the bottom dielectric layer in the first region and the second region;
 removing the charge storage layer from the second region;
 forming a top dielectric layer of the first transistor over the bottom dielectric layer in the first region and the second region;
 removing the top dielectric layer and the bottom dielectric layer from the second region;
 forming an oxide layer of the second transistor over the semiconductor substrate in the second region;
 after forming the oxide layer, forming a high-k dielectric layer of the first transistor and the second transistor in the first region and the second region;
 performing a patterning process to form a first stack in the first region and a second stack in the second region;
 forming a first gate electrode over the first stack; and
 forming a second gate electrode over the second stack.

16. The method of claim 15, wherein the high-k dielectric layer comprises a first portion over the first region and a second portion over the second region, and wherein a lower surface of the second portion is more proximal than a lower surface of the first portion to the semiconductor substrate.

17. The method of claim 15, wherein after forming the top dielectric layer, in a cross-section the charge storage layer is entirely bounded by the bottom dielectric layer and the top dielectric layer.

18. The method of claim 15, further comprising:
 before performing the patterning process, forming a dummy gate layer over the high-k dielectric layer in the first region and the second region; and
 after performing the patterning process, removing the dummy gate layer from the first region and the second region.

19. The method of claim 15, further comprising, after performing the patterning process, depositing a gate spacer layer along a sidewall of the first stack, an upper surface of the semiconductor substrate, and a sidewall of the second stack.

20. The method of claim 19, further comprising etching the gate spacer layer to form a first gate spacer along the sidewall of the first stack and a second gate spacer along the sidewall of the second stack.

* * * * *